US011373871B2

(12) United States Patent
Colombeau et al.

(10) Patent No.: US 11,373,871 B2
(45) Date of Patent: Jun. 28, 2022

(54) METHODS AND APPARATUS FOR INTEGRATED SELECTIVE MONOLAYER DOPING

(71) Applicant: APPLIED MATERIALS, INC., Santa Clara, CA (US)

(72) Inventors: Benjamin Colombeau, San Jose, CA (US); Wolfgang R. Aderhold, Cupertino, CA (US); Andy Lo, Sunnyvale, CA (US); Yi-Chiau Huang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 272 days.

(21) Appl. No.: 16/577,353

(22) Filed: Sep. 20, 2019

(65) Prior Publication Data
US 2020/0161134 A1 May 21, 2020

Related U.S. Application Data

(60) Provisional application No. 62/770,515, filed on Nov. 21, 2018.

(51) Int. Cl.
H01L 21/225 (2006.01)
H01L 29/66 (2006.01)
H01L 21/324 (2006.01)
H01L 21/02 (2006.01)

(52) U.S. Cl.
CPC .... *H01L 21/2254* (2013.01); *H01L 21/02057* (2013.01); *H01L 21/324* (2013.01); *H01L 29/66795* (2013.01)

(58) Field of Classification Search
CPC .......... H01L 21/2254; H01L 29/66795; H01L 21/324; H01L 21/02057
See application file for complete search history.

(56) References Cited

U.S. PATENT DOCUMENTS

| 5,693,139 A | 12/1997 | Nishizawa et al. |
| 6,518,136 B2 | 2/2003 | Lee et al. |
| 8,697,467 B2 | 4/2014 | Javey et al. |
| 8,956,983 B2 | 2/2015 | Swaminathan et al. |

(Continued)

OTHER PUBLICATIONS

Sarubbi, F., Scholtes, T.L.M. & Nanver, L.K. Chemical Vapor Deposition of α-Boron Layers on Silicon for Controlled Nanometer-Deep p + n Junction Formation. Journal of Elec Materi 39, 162-173. (Year: 2010).*

(Continued)

*Primary Examiner* — John P. Dulka
(74) *Attorney, Agent, or Firm* — Moser Taboada

(57) ABSTRACT

Methods and apparatus for forming doped material layers in semiconductor devices using an integrated selective monolayer doping (SMLD) process. A concentration of dopant is deposited on a material layer using the SMLD process and the concentration of dopant is then annealed to diffuse the concentration of dopant into the material layer. The SMLD process conforms the concentration of dopant to a surface of the material layer and may be performed in a single CVD chamber. The SMLD process may also be repeated to further alter the diffusion parameters of the dopant into the material layer. The SMLD process is compatible with p-type dopant species and n-type dopant species.

15 Claims, 3 Drawing Sheets

(56) References Cited

U.S. PATENT DOCUMENTS

| | | | |
|---|---|---|---|
| 9,779,948 B1 | 10/2017 | Baraskar et al. | |
| 2008/0227259 A1 | 9/2008 | Avouris et al. | |
| 2011/0169049 A1 | 7/2011 | Loo et al. | |
| 2013/0175579 A1 | 7/2013 | Cheng et al. | |
| 2015/0380249 A1* | 12/2015 | Gouk ................ | H01L 29/66803 438/559 |
| 2017/0170018 A1 | 6/2017 | Kim et al. | |
| 2018/0175170 A1* | 6/2018 | Tsai ..................... | H01L 21/324 |

OTHER PUBLICATIONS

International Search Report and Written Opinion for PCT/US2019/062140 dated Mar. 11, 2020.
U.S. Appl. No. 16/577,353, filed Sep. 20, 2019.

\* cited by examiner

METHODS AND APPARATUS FOR INTEGRATED SELECTIVE MONOLAYER DOPING

CROSS-REFERENCE TO RELATED APPLICATIONS

This application claims benefit of U.S. provisional patent application Ser. No. 62/770,515, filed Nov. 21, 2018 which is herein incorporated by reference in its entirety.

FIELD

Embodiments of the present principles generally relate to semiconductor processing.

BACKGROUND

The addition of a small percentage of foreign atoms in a regular crystal lattice of silicon or germanium produces changes in the electrical properties of the material. The added impurities, or dopants, in the crystal lattice can be controlled to produce different electrical characteristics such as n-type or p-type semiconductor materials. Metal oxide semiconductors (MOS) utilize structures that include n-type and p-type doped materials to regulate the flow of electricity. The inventors have observed that the traditional doping processes are time consuming and increase production costs. The traditional doping processes are performed over a surface of a substrate, areas of the substrate that are not to be doped must be masked to limit the doping area of the substrate field. As the sizes of the semiconductor structures shrink, higher and higher masking resolutions are required to control the doping areas, reducing yields and requiring more specialized equipment.

Accordingly, the inventors have provided improved methods and apparatus for doping of semiconductor structures.

SUMMARY

Methods and apparatus for an integrated selective monolayer doping (SMLD) process for semiconductor structures are provided herein.

In some embodiments, a method for forming a doped semiconductor feature comprises depositing a concentration of dopant on a material layer using a selective monolayer doping (SMLD) process.

In some embodiments, the method may further comprise exposing the doped semiconductor feature to a gas mixture containing a dopant to selectively deposit the concentration of dopant on the material layer, varying an exposure duration of the gas mixture or a dopant concentration in the gas mixture to control a density of the concentration of dopant on the material layer, conforming the concentration of dopant to a surface of the material layer with the SMLD process, wherein the method is performed in a single semiconductor processing chamber, annealing the concentration of dopant to diffuse the concentration of dopant into the material layer, repeating the method to increase the concentration of dopant in the material layer, altering a temperature of an anneal to change a depth of penetration of a the concentration of dopant into the material layer, altering a duration of a deposition of the concentration of dopant to increase an amount of active dopant in the concentration of dopant, depositing a concentration of dopant that includes a p-type dopant species, wherein the p-type dopant species includes boron or gallium, depositing a concentration of dopant that includes an n-type dopant species, wherein the n-type dopant species includes arsenic or phosphorus, pre-cleaning a surface of the material layer before depositing the concentration of dopant, and/or integrating the SMLD process in a formation of a source/drain of a semiconductor structure.

In some embodiments, a method for forming a doped semiconductor feature on a substrate having a first material with non-dielectric properties and a second material with dielectric properties comprises soaking the substrate with a gas containing concentrations of a dopant, the gas selectively forming a monolayer of the dopant on a first surface of the first material but not on a second surface of the second material and annealing the substrate to diffuse the dopant into the first material.

In some embodiments, the method may further comprise varying a gas soak duration, a gas soak pressure, a gas soak flow rate, or a gas soak dopant concentration to control the dopant diffusion parameters; repeating the method while altering a temperature of an anneal in at least one cycle to change a depth of penetration of the concentration of dopant into the first material; and/or repeating the method while altering a gas soak duration, a gas soak pressure, a gas soak flow rate, or a gas soak dopant concentration in at least one cycle to alter an amount of dopant on the first surface of the first material.

In some embodiments, a method for forming a doped semiconductor feature on a substrate having a first material with non-dielectric properties and a second material with dielectric properties may comprise soaking the substrate with a gas containing concentrations of a dopant, the gas selectively forming a monolayer of the dopant on a first surface of the first material but not on a second surface of the second material; annealing the substrate to diffuse the dopant into the first material; and repeating the method while altering a gas soak duration, a gas soak pressure, a gas soak flow rate, or a gas soak dopant concentration in at least one cycle to alter an amount of dopant on the first surface of the first material and repeating the method while altering a temperature of an anneal in at least one cycle to change a depth of penetration of the dopant into the first material.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
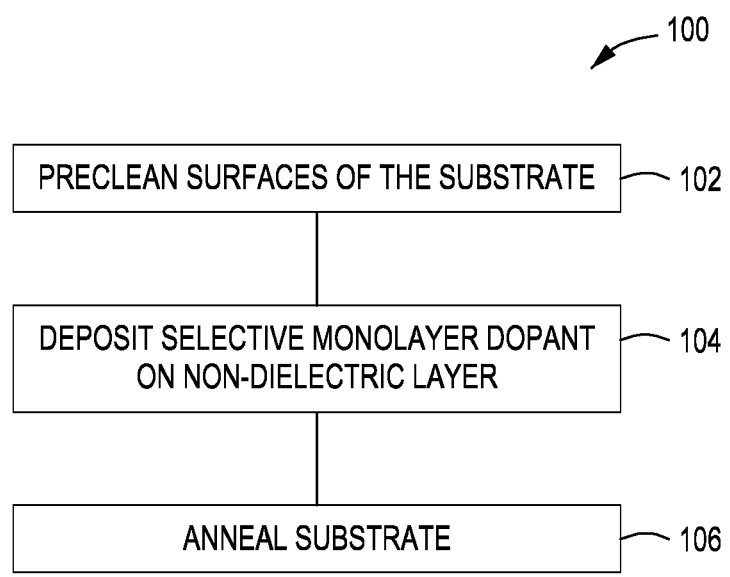
FIG. 1 is a method of performing selective monolayer doping of semiconductor structures in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide selective monolayer doping (SMLD) of semiconductor materials. The SMLD process advantageously implants dopants into non-dielectric materials of a semiconductor structure without altering dielectric areas found on a substrate. The SMLD process is conformal, allowing implanting of dopants laterally as well as vertically into any form of geometric shape of a semiconductor device. Very high concentrations of dopants can be achieved by repeating the SMLD process until a desired state of doping is achieved. The SMLD process can also be advantageously performed in a single semiconductor processing devices such as, for example, a chemical vapor deposition chamber. The SMLD process does not alter the shape of or damage the crystal lattice of the doped semiconductor structure, permitting continued shrinkage of the size of future semiconductor structures.

Figure 2:
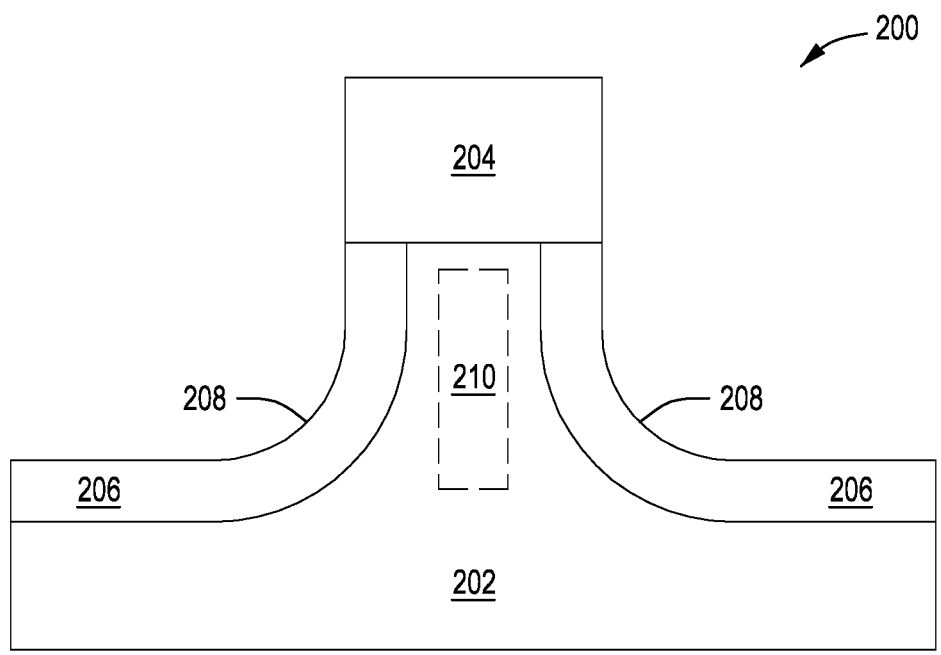
FIG. 2 is a cross-sectional view of a semiconductor structure in accordance with some embodiments of the present principles.

FIG. 1 is a method 100 of performing selective monolayer doping of semiconductor structures in accordance with some embodiments. The discussion of the method 100 will reference semiconductor structures 200, 300, 400 of FIGS. 2, 3, and 4 respectively. FIG. 2 is a cross-sectional view of a semiconductor structure 200 in accordance with some embodiments. The semiconductor structure 200 is formed on a substrate 202 and represents an example structure on which the method 100 may be performed. The method 100 is not limited to any specific structure geometry. In the semiconductor structure 200, a dielectric feature 204 has been formed on top of a protrusion of the substrate 202 and a non-dielectric layer 206 has been deposited on the substrate 202 up to a bottom surface of the dielectric feature 204. The dielectric feature 204 may include, but is not limited to, a gate structure for a pMOS device and the like. The non-dielectric layer 206 may be deposited on the substrate 202 to form a source/drain extension (SDE) region of the pMOS device. In some embodiments, the substrate 202 may be a silicon material or a silicon-germanium material.

In some embodiments, the non-dielectric layer 206 may be p-doped regions that form the source and drain extensions of, for example, a fin field-effect transistor (finFET) and may include one or more p-dopants. The p-doped extension regions may include one or more p-dopants that act as a diffusion barrier for the p-dopants located in heavily p-doped source/drain regions (not shown). Because the p-doped extension regions are disposed between a channel region 210 and the heavily p-doped regions, p-dopants located in the heavily p-doped regions, such as boron, cannot diffuse into the channel region 210. P-dopant diffusion can be a challenge in pMOS devices, such as finFET, because of the ever decreasing sizes. In some embodiments, the p-dopants located in the heavily p-doped regions may include gallium. In such embodiments, the p-dopants included in p-doped extension regions may include boron which can act as a significant diffusion barrier to gallium diffusion or simply as a spatial (geometrical) offset.

In block 102 of the method 100, an optional pre-cleaning or surface preparation process may be performed on the surfaces of the substrate 202. The surface preparation process may be performed to remove native oxide on surfaces 208. The surface preparation process may include a dry etch process, a wet etch process, or a combination of both. The dry etch process may include a conventional plasma etch, or a remote plasma-assisted dry etch process, such as a SICONI® etch process, available from Applied Materials, Inc., located in Santa Clara, Calif. In a SICONI® etch process, surfaces 208 are exposed to $H_2$, $NF_3$, and/or $NH_3$ plasma species, e.g., plasma-excited hydrogen and fluorine species. For example, in some embodiments, surfaces 208 may undergo simultaneous exposure to $H_2$, $NF_3$, and $NH_3$ plasma. The SICONI® etch process may be performed in a SICONI® Pre-clean chamber, which may be integrated into one of a variety of multi-processing platforms, including the Centura™, Dual ACP, Producer™ GT, and Endura platform, available from Applied Materials. The wet etch process may include a hydrofluoric (HF) acid last process, i.e., the so-called "HF last" process, in which HF etching of surfaces 208 is performed that leaves surfaces 208 hydrogen-terminated.

Figure 3:
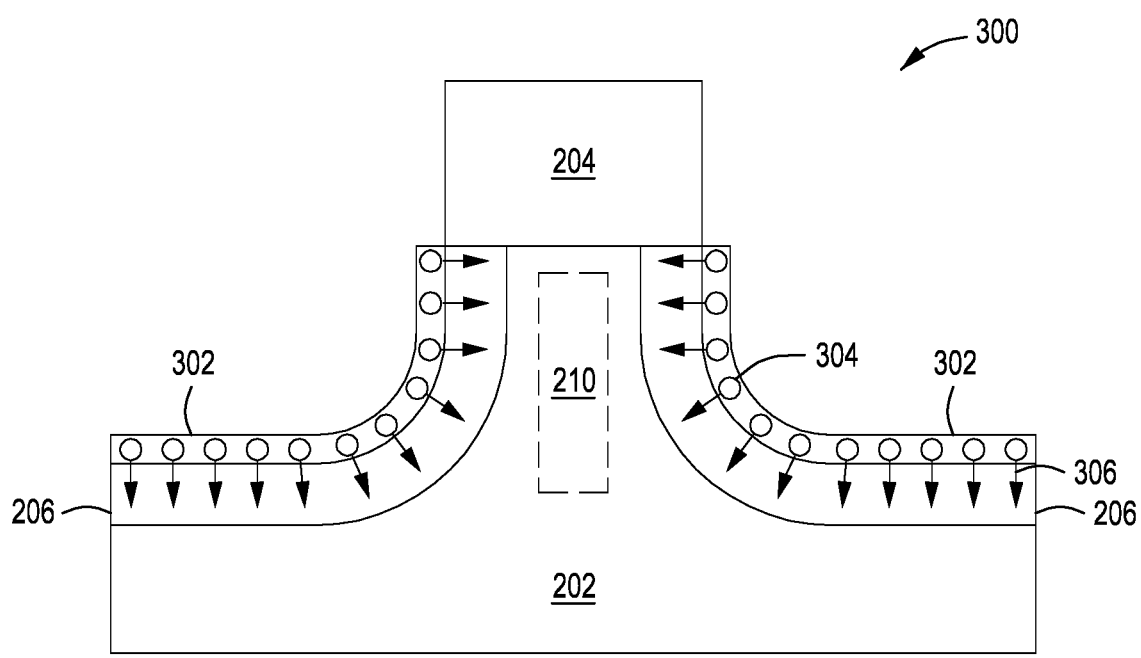
FIG. 3 is a cross-sectional view of a semiconductor structure after deposition of a selective monolayer doping layer in accordance with some embodiments of the present principles.

In block 104 of the method 100, an SMLD layer 302 is deposited on the substrate 202. The selective nature of the SMLD layer 302 causes the formation on the non-dielectric layer 206 and not on the dielectric feature 204 as illustrated in FIG. 3. In some embodiments, the selective nature of the SMLD layer may form a monolayer dopant on surfaces of silicon and/or silicon-germanium. In some embodiments, the duration of the deposition of the SMLD layer may be varied to alter the concentration of dopant species deposited on the non-dielectric layer 206. The deposition of the SMLD layer 302 is conformal in nature and allows the SMLD layer 302 to be deposited on vertically and laterally, unlimited by the geometry of features on the substrate 202. The conformal ability of the SMLD layer is advantageous over other methods such as ion implantation which is limited by the angle of the ion beam and the size of the structure on the substrate. Additionally, the SMLD layer diffuses dopants into the non-dielectric layer without causing damage to or defects in an underlying crystal lattice structure. The method 100 is able to achieve very high concentration of dopants such as, for example, more than 2e20 atoms/$cm^3$ dopant concentration of electrically active boron or gallium for p-type semiconductor devices without damage. The very high concentrations are also achievable in material that lies beneath other features on the substrate due to the lateral diffusing capability provided by the conformal nature of the SMLD layer 302.

In some embodiments, the SMLD layer 302 is accomplished by soaking the substrate with a gas such as, but no limited to, diborane and the like to provide a selective monolayer of the p-type dopant boron on the non-dielectric surfaces of the substrate 202. The diborane gas does not interact with dielectric surfaces and provides a selective process for depositing a monolayer of dopant on non-dielectric materials. In some embodiments, other gases and gas combinations/mixtures may be used to deposit other p-type species or n-type species dopants on the non-dielectric surfaces of the substrate 202. The gas expands to selectively provide a monolayer of dopants on the non-dielectric surfaces without regard to the orientation of the surfaces. The gas also allows the monolayer of dopants to conform to the surface. In some embodiments, the gas soaking duration and/or the gas dopant concentration may be varied to yield different dopant concentrations and/or penetration depths in the non-dielectric material. In some embodiments, the gas pressure and flow rate may be varied to yield different dopant concentrations and/or penetration depths of the dopant in the non-dielectric material.

Figure 4:
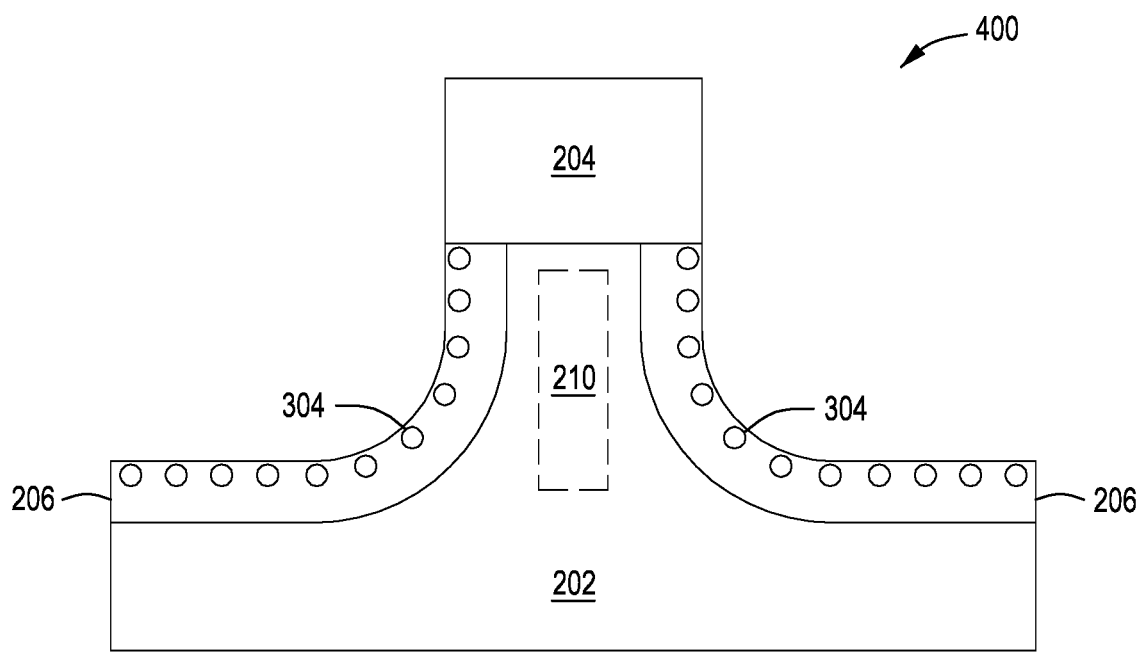
FIG. 4 is a cross-sectional view of a semiconductor structure after dopants are diffused into a non-dielectric layer in accordance with some embodiments of the present principles.
Figure 5:
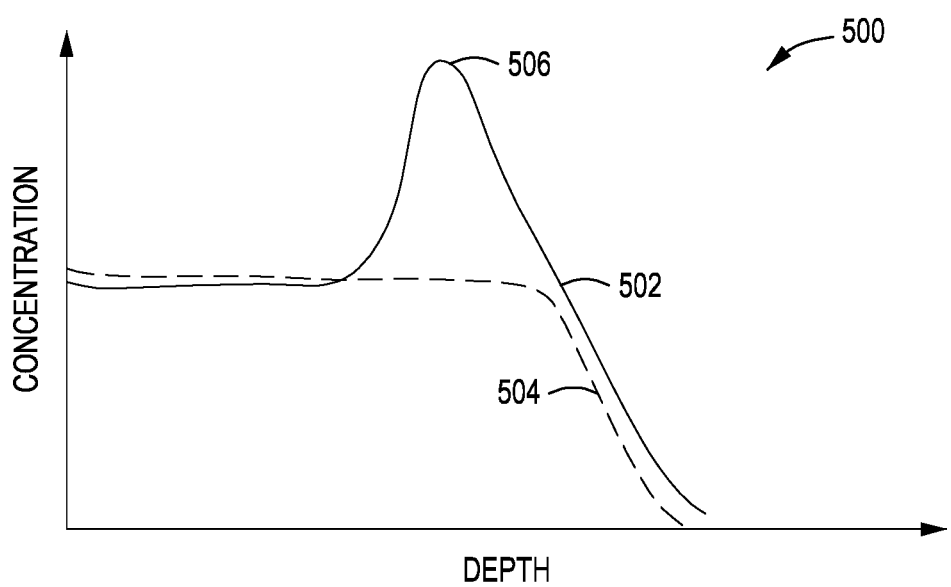
FIG. 5 is a graph of active concentrations in a selective monolayer doped non-dielectric material in accordance with some embodiments of the present principles.

In block 106, the substrate 202 is then annealed which diffuses the dopant molecules 304 of the SMLD layer 302 into the non-dielectric layer 206 as shown by the arrows 306 of FIG. 3. In some embodiments, the anneal temperature and duration may be adjusted to vary the depth that the dopant is diffused into the material and the dopant concentration. In FIG. 4, the dopant molecules 304 have been diffused into the non-dielectric layer 206. For structures such as pMOS devices, the p-type dopant species may include, but are not limited to, boron and gallium. In some embodiments, the method 100 may be used for nMOS devices with n-type doping species such as, for example, arsenic and phosphorus. In some embodiments, the annealing process may include use of a laser-based anneal such as with a dynamic scan anneal (DSA) process. In some embodiments, the anneal process may be the same anneal process used to activate the source/drain. The SMLD process may be integrated into an existing source/drain formation process through the addition of the gas soaking process to form the SMLD layer 302 prior to the existing anneal process. The integration of the SMLD process provides a very cost efficient and easy means to enhance dopant concentration in source/drain extensions.

The method 100 provides a very high concentration of dopants 506 while improving the drop-off gradient 502 (compared to standard implant processes 504) in diffusion to ensure dopant diffusion under features such as a gate in, for example, source/drain extension formation as illustrated by the graph 500. The method 100 works well for gate all around (GAA) and finFET semiconductor devices. The method 100 also has the benefit being accomplished using a single chamber like, for example, a CVD chamber. In some embodiments, the deposition of the SMLD layer and anneal may be a cyclic process where the anneal parameters may be changed for one or more cycles to control the depth and/or concentrations of the dopants.

While the foregoing is directed to embodiments of the present principles, other and further embodiments of the principles may be devised without departing from the basic scope thereof.

The invention claimed is:

1. A method for forming a doped semiconductor feature on a substrate having a first material with non-dielectric properties and a second material with dielectric properties, comprising:
    soaking the substrate with a gas containing concentrations of a dopant, the gas selectively forming a monolayer of the dopant on a first surface of the first material but not on a second surface of the second material;
    annealing the substrate to diffuse the dopant into the first material; and
    repeating the method while altering a gas soak duration, a gas soak pressure, a gas soak flow rate, or a gas soak dopant concentration in at least one cycle to alter an amount of dopant on the first surface of the first material.

2. The method of claim 1, further comprising:
    varying a gas soak duration, a gas soak pressure, a gas soak flow rate, or a gas soak dopant concentration to control dopant diffusion parameters.

3. The method of claim 1, further comprising:
    conforming concentrations of dopant to the first surface of the first material.

4. The method of claim 1, wherein the method is performed in a single semiconductor processing chamber.

5. The method of claim 1, further comprising:
    altering a temperature of an anneal to change a depth of penetration of the dopant into the first material.

6. The method of claim 5, further comprising:
    altering a duration of a deposition of the dopant to increase an amount of active dopant in the concentrations of the dopant.

7. The method of claim 1, further comprising:
    depositing concentrations of dopant that include a p-type dopant species.

8. The method of claim 7, wherein the p-type dopant species includes boron or gallium.

9. The method of claim 1, further comprising:
    depositing concentrations of dopant that include an n-type dopant species.

10. The method of claim 9, wherein the n-type dopant species includes arsenic or phosphorus.

11. The method of claim 1, further comprising:
    pre-cleaning the first surface of the first material before depositing concentrations of dopant.

12. The method of claim 1, further comprising:
    integrating the method in a formation of a source/drain of a semiconductor structure.

13. A method for forming a doped semiconductor feature on a substrate having a first material with non-dielectric properties and a second material with dielectric properties, comprising:
    soaking the substrate with a gas containing concentrations of a dopant, the gas selectively forming a monolayer of the dopant on a first surface of the first material but not on a second surface of the second material;
    annealing the substrate to diffuse the dopant into the first material; and
    repeating the method while altering a temperature of an anneal in at least one cycle to change a depth of penetration of the dopant into the first material.

14. The method of claim 13, further comprising:
    varying a gas soak duration, a gas soak pressure, a gas soak flow rate, or a gas soak dopant concentration to control dopant diffusion parameters.

15. A method for forming a doped semiconductor feature on a substrate having a first material with non-dielectric properties and a second material with dielectric properties, comprising:
    soaking the substrate with a gas containing concentrations of a dopant, the gas selectively forming a monolayer of the dopant on a first surface of the first material but not on a second surface of the second material;
    annealing the substrate to diffuse the dopant into the first material; and
    repeating the method while altering a gas soak duration, a gas soak pressure, a gas soak flow rate, or a gas soak dopant concentration in at least one cycle to alter an amount of dopant on the first surface of the first material and repeating the method while altering a temperature of an anneal in at least one cycle to change a depth of penetration of the dopant into the first material.

* * * * *